(12) United States Patent
Kotecki et al.

(10) Patent No.: US 6,544,832 B2
(45) Date of Patent: Apr. 8, 2003

(54) METHOD OF FABRICATING A STACK CAPACITOR DRAM

(75) Inventors: David E. Kotecki, Hopewell Junction, NY (US); William H. Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/883,469

(22) Filed: Jun. 18, 2001

(65) Prior Publication Data

US 2001/0035551 A1 Nov. 1, 2001

Related U.S. Application Data

(62) Division of application No. 09/064,547, filed on Apr. 22, 1998, now Pat. No. 6,262,450.

(51) Int. Cl.[7] .................. H01L 21/8242; H01L 21/20
(52) U.S. Cl. .................. 438/239; 438/240; 438/253; 438/254; 438/381; 438/391
(58) Field of Search .................. 438/238, 239, 438/240, 253, 254, 381, 396

(56) References Cited

U.S. PATENT DOCUMENTS

| | | |
|---|---|---|
| 5,175,121 A | 12/1992 | Choi et al. |
| 5,227,322 A | 7/1993 | Ko et al. |
| 5,420,056 A | 5/1995 | Moslehi |
| 5,605,856 A | 2/1997 | Goosen et al. |
| 5,605,857 A | 2/1997 | Jost et al. |
| 5,635,423 A | 6/1997 | Huang et al. |
| 5,688,713 A | 11/1997 | Linliu et al. |
| 5,702,989 A | 12/1997 | Wang et al. |
| 5,821,139 A | 10/1998 | Tseng |
| 5,976,977 A | 11/1999 | Hong |
| 6,025,221 A | 2/2000 | Brown |

OTHER PUBLICATIONS

Y. Kohyama et al. "A Fully Printable, Self–aligned & Planarized Stacked Capacitor DRAM Cell Technol for 1Gbit DRAM and Beyond" 1997 Symposium on VLSI Tech. Digest Tech. Papers, pp. 17 & 18.

Primary Examiner—Wael Fahmy
Assistant Examiner—Shrinivas H. Rao
(74) Attorney, Agent, or Firm—RatnerPrestia; Jay H. Anderson, Esq.

(57) ABSTRACT

A DRAM capacitor contact comprised of a silicon oxide layer with a trench having sidewalls and a form in the silicon oxide layer. A dielectric liner is coated on the sidewalls of the trench. A metal layer is then deposited between the sidewalls and polished to form a bit-line. One or more dielectric layers are deposited above the bit-lines and VIAs are formed in these layers. A sidewall is formed in the VIA above the bit-line and the VIAs are extended down to the silicon substrate and filled with a conductive material and planarized, forming the capacitor contact.

14 Claims, 10 Drawing Sheets

METHOD OF FABRICATING A STACK CAPACITOR DRAM

This application is a divisional of U.S. patent application Ser. No. 09/064,547, filed on Apr. 22, 1998, U.S. Pat. No. 6,262,450 which has been allowed.

FIELD OF THE INVENTION

The present invention relates to a structure and method for fabricating a stack capacitor DRAM, and more specifically, a stack capacitor DRAM having a capacitor over a bit-line and where the bit-line is formed using a damascene process.

BACKGROUND OF THE INVENTION

Dynamic Random Access Memories (DRAMs) have memory cells that can only retain information on a temporary basis, even with power continuously applied. Accordingly, DRAM cells must be read and refreshed at periodic intervals in order to function as storage devices. Although DRAM cells typically take up less physical space than other types of memory storage devices such as Static Random Access Memories (SRAMs), it has been desirous to design and manufacturer ever smaller memory DRAM cells.

Like all random access memories, DRAMs are divided into separate storage cells of memory which are arranged in an array consisting of horizontal rows and vertical columns. Each cell shares electrical connections with all other cells in its row and column. Horizontal lines connected to all of the cells in the row are called word-lines. The vertical lines are called bit-lines. Each storage cell contains a capacitor and a transfer device. Data flows into and out of the cells along the bit-lines. The word-lines act as a switch and transfer data from the bit-line to the cell capacitor. Each memory cell therefore has a number of unique memory locations, or addresses, each of which can be addressed through the selection of the appropriate word-line and bit-line combination. In addition, there are also a number of support circuits at the periphery of the arrays of memory cells. Examples of typical support circuits include an address decoder, sense amplifier, and refresh circuitry.

In the ongoing drive to produce higher capacity DRAM storage devices, various capacitor structures have been developed to produce sufficient capacitances in a limited space. Each capacitor and transfer device which can be added to an array, effectively increases the memory capacity of the memory storage device. The capacitor can be located under the transfer device as a trench capacitor, or above the transfer device, as a stacked-capacitor. In both arrangements, one electrode of the capacitor is connected to the transfer device while the other electrode serves as a common plate joining all memory cells.

The stacked capacitor DRAM cell is itself one method of increasing memory capacity by shrinking the size of the memory cell without loss of storage capacity. In a stack capacitor DRAM cell, a capacitor structure is stacked on top of an access transistor formed on a semi-conductor substrate. The capacitor consists of a bottom electrode, a dielectric film, and an upper electrode. The bottom electrode is connected to the source region (diffused or ion implanted region) of the access transistor. This connection may be formed from a conducting material, such as polycrystalline silicon doped with an impurity, a metal, a conductive metal oxide, a conductive, a metal nitride, or some combination of the above. In a stack-capacitor DRAM, the bit-line can run either over the top electrode of the capacitor, or under the bottom electrode of the capacitor.

In a capacitor over bit-line configuration, a factor which affects the size of the DRAM cell is that the capacitor contact must be made in the space defined by the intersection of bit-lines and word-lines. Reducing the cell size effectively reduces the area for the capacitor contact, as the bit-lines and word-lines close in on this framed area. This reduced area for the capacitor contact reduces the tolerance of any misalignment of the capacitor contact to the bit-lines and word-lines during lithographic definition of the capacitor contact.

A damascene process is a process used in some aspects of semiconductor fabrication. It is a process of inlaying a metal into a predefined pattern, typically in a dielectric layer. It is typically performed by defining the desired pattern into a dielectric film; depositing metal over the entire surface by either physical vapor deposition, chemical vapor deposition, or evaporation; then polishing back the top surface in such a way that the top surface is planarized and the metal pattern is only located in the predefined regions of the dielectric layer. The damascene process has been used in manufacturing of metal wiring lines, including the bit-lines for a DRAM capacitor.

SUMMARY OF THE INVENTION

The present invention involves the fabrication of a capacitor contact for a stacked-capacitor DRAM cell with the capacitor over the bit-line, which is borderless to the word-line and either bordered or quasi-borderless to the bit-line, and in which the bit-line is formed by means of a damascene process.

The present invention involves a DRAM capacitor contact comprised of a silicon oxide layer with a trench having sidewalls and a form in the silicon oxide layer. A dielectric liner is coated on the sidewalls of the trench. A metal layer is then deposited between the sidewalls and polished to form a bit-line. one or more dielectric layers are deposited above the bit-lines and VIAs are formed in these layers. A sidewall is formed in the VIA above the bit-line and the VIAs are extended down to the silicon substrate and filled with a conductive material and planarized, forming the capacitor contact.

BRIEF DESCRIPTION OF THE DRAWINGS

The invention will now be described by way of non-limiting examples, with reference to the attached drawings in which.

DETAILED DESCRIPTION OF THE INVENTION

Figure 1:
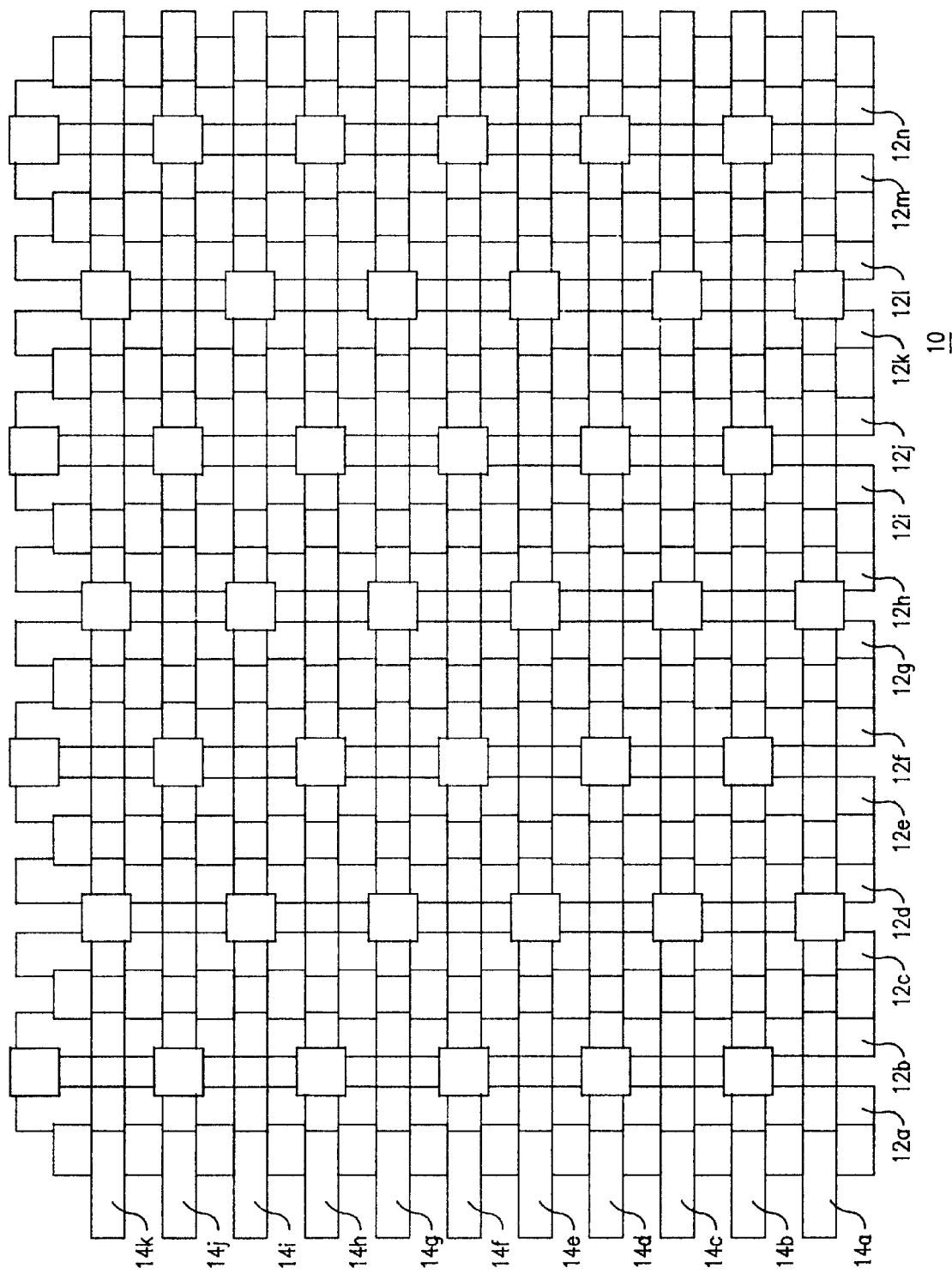
FIG. 1 is a top view of a DRAM cell layout 10.

There is shown in FIG. 1 a top view of a cell layout for a stack capacitor DRAM 10. DRAM 10 has word-lines 12 which are separately identified in the exemplary embodiment of FIG. 1 as word-lines 12a–12n. Bit-lines 14 are shown in the exemplary embodiment of FIG. 1 as bit-lines 14a–14k.

Figure 2:
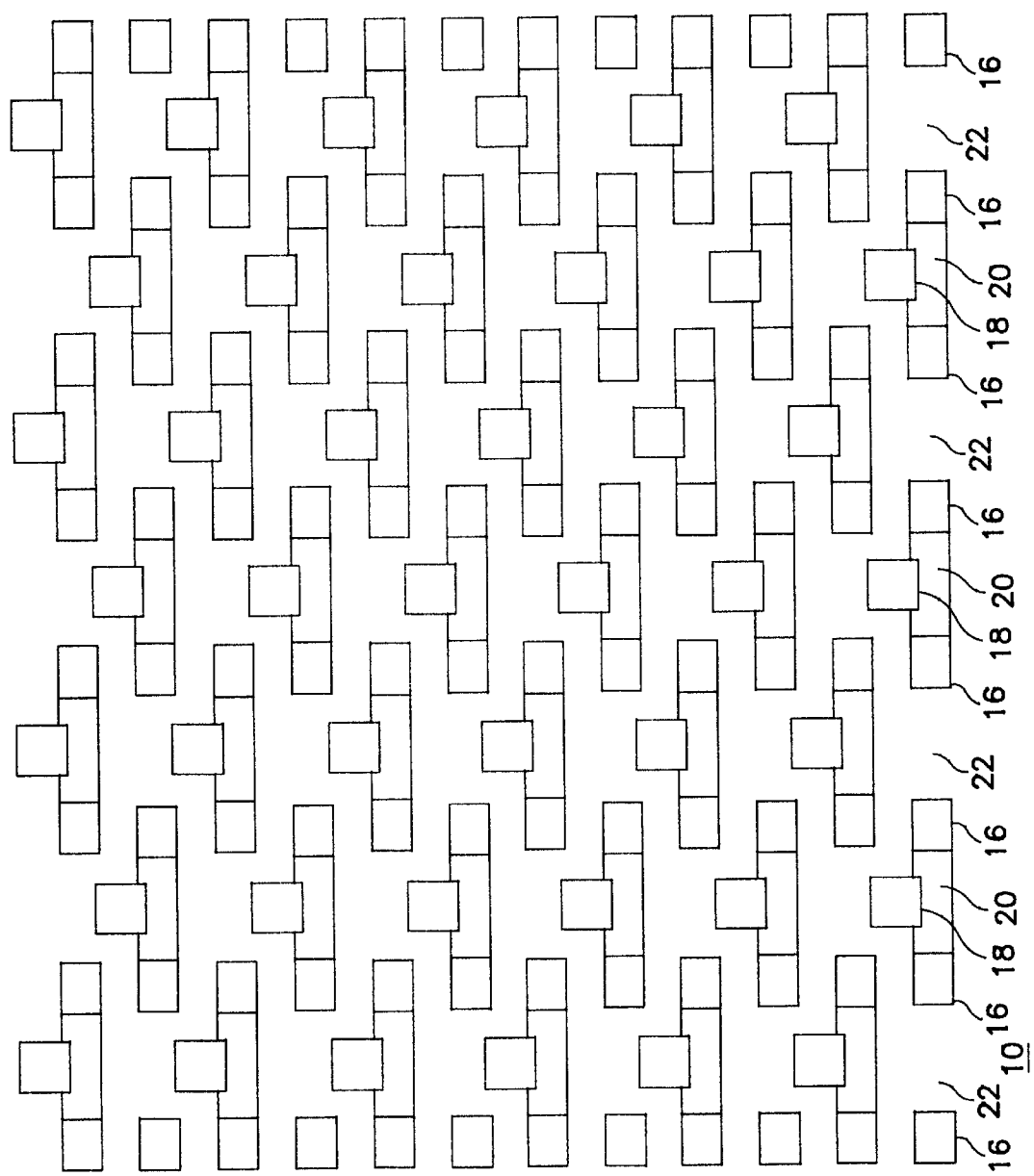
FIG. 2 is a view of a layout of DRAM cell 10 through a different layer than that of FIG. 1.

FIG. 2 shows a top view of DRAM 10 of a different layer (level) than that shown in FIG. 1. In FIG. 2, capacitor contact 16 and bit-line contact location 18 are collectively identified as active area 20. A shallow trench isolation (STI) 22 is also shown between each of the capacitor contacts 16.

Figure 3:
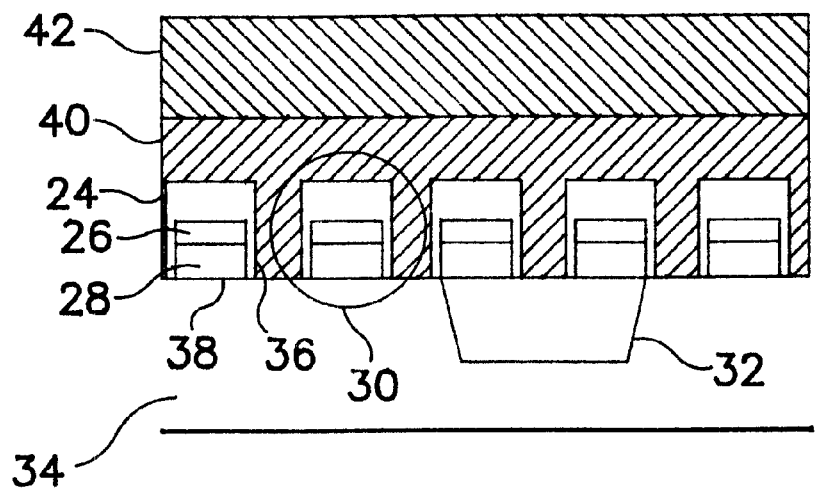
FIGS. 3–11 show the cross-sectional process flow of forming a DRAM cell with a capacitor over the bit-line in which the capacitor contact which is borderless to the word-line and quasi-borderless to a bit-line, and in which the bit-line is formed using a damascene process.

FIG. 3 shows a cross-section of the memory cell array of DRAM 10 after the formation of the word-line and additional dielectric stack. Memory array 10 is comprised of a plurality of gate stacks 30. Each gate stack 30 is comprised of a polysilicon layer 28 deposited on top of a gate oxide layer 38. A silicide layer 26, tungsten silicide ($WSi_x$) in an exemplary embodiment, is deposited on polysilicon layer 28. A dielectric layer 24, silicon nitride in an exemplary embodiment, sits a top the silicide layer 26. A dielectric layer 36, silicon nitride in an exemplary embodiment, is formed over the entire structure, extending downward to oxide layer 38 and on the sides of the other layers, isolating tungsten silicide 26 and polysilicon 28 from the space which exists between adjacent gate stack 30. All of these layers are formed using techniques which are well known in the art.

Shallow trench isolation 32 is comprised of a silicon dioxide ($SiO_2$) layer which extends into substrate 34 and separates the active areas 20. A plurality of dielectric layers 40 and 42 are deposited on gate stacks 30 and planarized by techniques which are well known in the art. These dielectric layers are chosen from the list of materials including silicon oxide, silicon nitride, doped silicon oxide, boron-silicate glass, phosphorus-silicate glass, boron-phosphorus-silicate glass.

Figure 4:
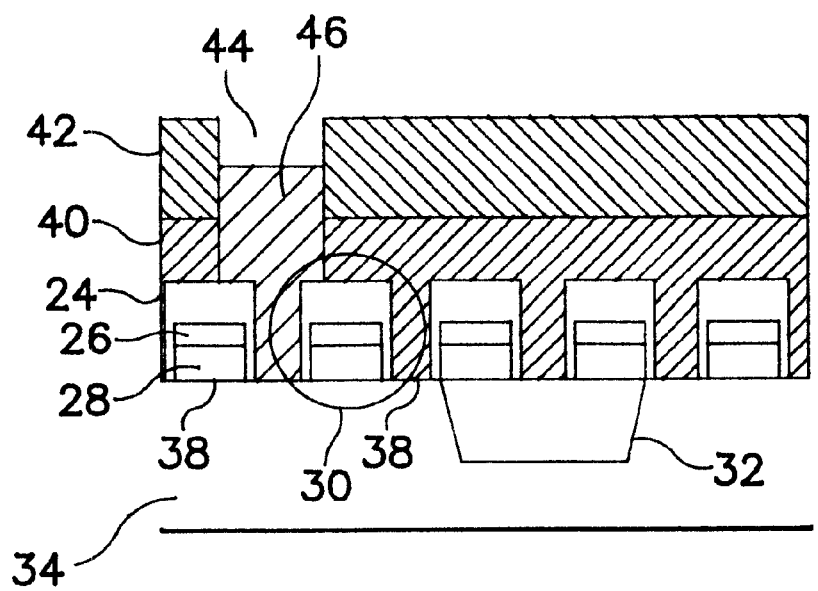

FIG. 4 shows the first step after starting with the plurality of gate stacks 30 and dielectric layers 40 and 42 in the process of fabricating the bit-line and capacitor contact of the present invention. The bit-line contact VIAs 44 are made in the oxide layers by a lithographic process such as a deep ultraviolet (DUV) lithography, which is well known in the art. This is followed by reactive ion etching of dielectric layers 43, 40, 36 and 38 to form VIAs down to silicon substrate 34. The VIA depth is nominally 2000 to 5000 Å. Dielectric layer 38 is then opened by a reactive ion etch process using a different chemistry, such as followed by a cleaning of the surface. A conductive material 46, such as doped amorphous or polycrystalline silicon or tungsten, is deposited in VIA 44 using a chemical vapor deposition process. The plug material is then etched-back and recessed in the VIA, by any of a number of techniques including wet etching, chemical mechanical polishing, reactive ion etching, or high pressure isotropic etching, or a combination of these techniques.

Figure 5A:
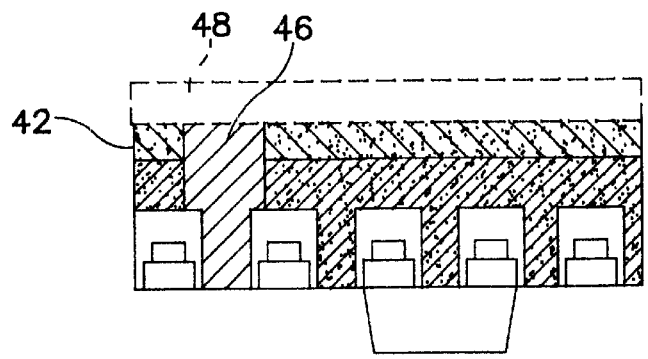
Figure 5B:
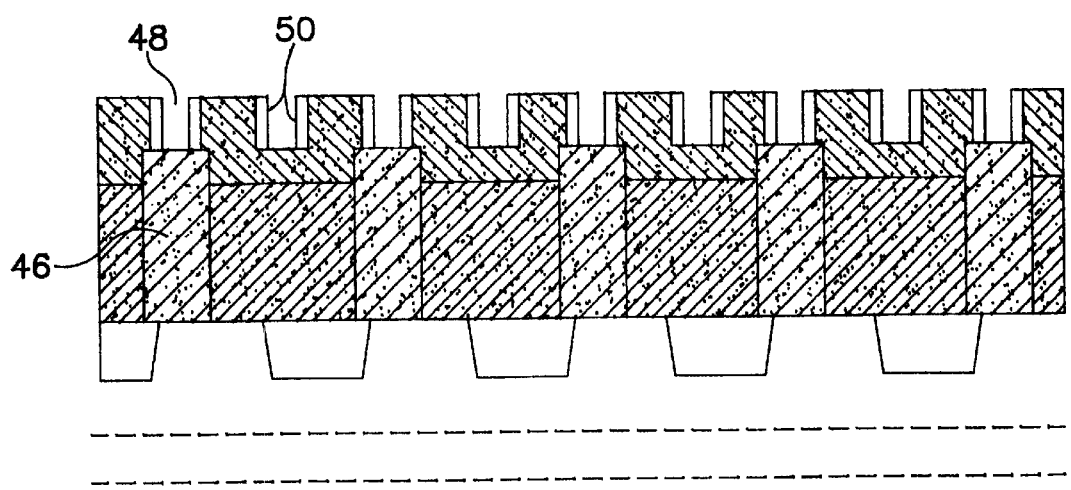

In FIGS. 5a and 5b, bit-line trough 48 is formed in dielectric layer 42 using a lithographic patterning technique followed by reactive ion etching of layer 42. FIG. 5b shows the cross-section of memory cell array 10 structure in a direction perpendicular to the bit-line while FIG. 5a shows memory cell array 10 structure in the direction parallel to the bit-line.

A dielectric layer is conformally deposited within the trough 48 to form a spacer 50 using either a low pressure chemical vapor deposition (LPCVD) process, a plasma enhanced chemical vapor deposition (PECVD) process, or a physical vapor deposition process, and reactive ion etching is used to form a first sidewall spacer 50. The width of spacer 50 should be ¼ to ½ the minimum lithographic feature. In an exemplary embodiment, the spacer width is approximately 500 Å. The sidewall material may be the same or different than dielectric layers 40 and 42. Spacers 50 can consist of silicon nitride, silicon dioxide, doped silicon dioxide, an insulating metal oxide or an insulating polymeric material. Spacers 50 are formed with a nominal thickness in the range of 100–1000 Å.

Figure 6A:
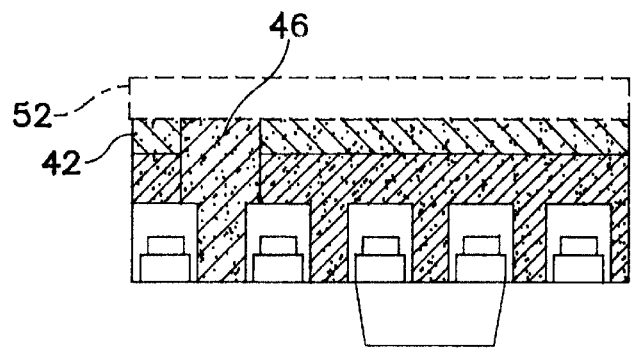
Figure 6B:
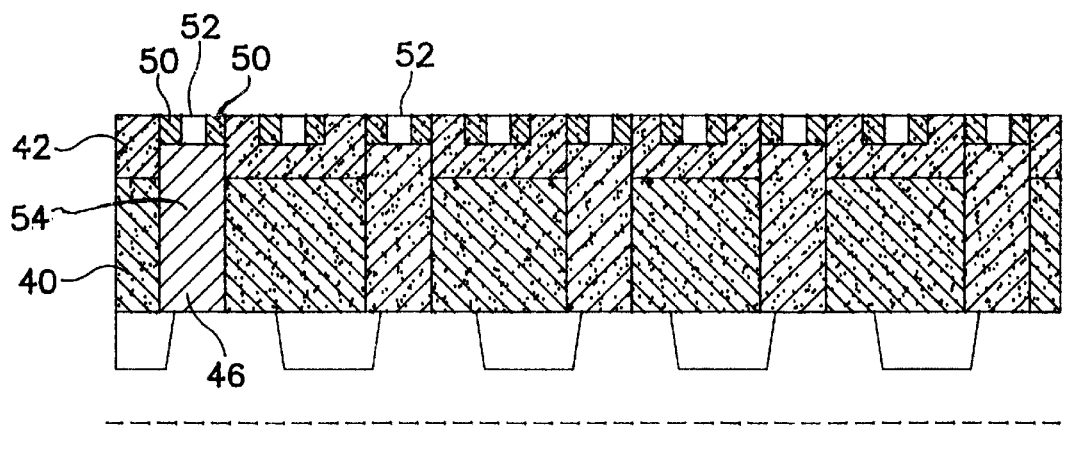

In FIGS. 6a and 6b, a metal stack 52, consisting of a first layer which is typically titanium or titanium nitride and a second metal layer which can be tungsten or tungsten silicide, is deposited on the surface by a combination of chemical vapor deposition (CVD), physical vapor deposition (PVD) or evaporation. The thickness of the metal deposition is typically 50–300 Å for the first layer followed by 2000–4000 Å for the second metal layer. Following the deposition of the final metal layer, the surface is planarized by either a chemical mechanical polish or an etch back technique to leave the metal layers only in the dielectric trough 48, forming a bit line. In FIG. 6b, the view of bit-line 52 is shown perpendicular to the view shown in FIG. 6a. The deposited bit-line 52 is shown in a position between spacer 50 and on top of polysilicon bitline contact 54.

Figure 7:
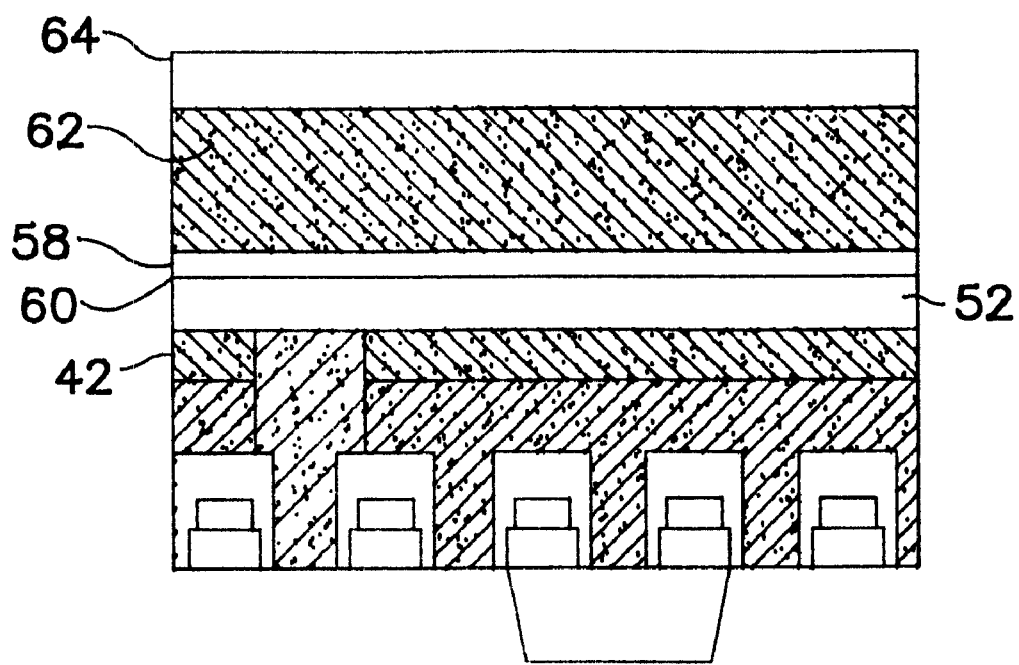

In FIGS. 7–11, contact plug 56 (FIG. 11) to the stacked capacitor is formed. First, as shown in FIG. 7, a first dielectric layer 58, which is selected from silicon nitride, silicon oxide, doped silicon oxide, metal oxide, or other insulating layers is deposited on surface 60. Next, a second dielectric layer 62 is deposited on top of the first dielectric layer 58. Dielectric layer 62 can be the same or different than the first dielectric layer 58 and chosen from the same list of materials as dielectric layer 58. Next, a third layer 64, which serves as a hard mask etch layer, is formed on dielectric layer 62. This layer can consist of polysilicon, amorphous silicon, silicon nitride, silicon dioxide, metal oxides, metal nitrides, or a metal. Dielectric layer 58 has a thickness in the range of 200–1500 Å. Dielectric layer 62 has a thickness of approximately 1000–4000 Å. Hard mask layer 64 has a thickness of approximately 500–7500Å.

Figure 8A:
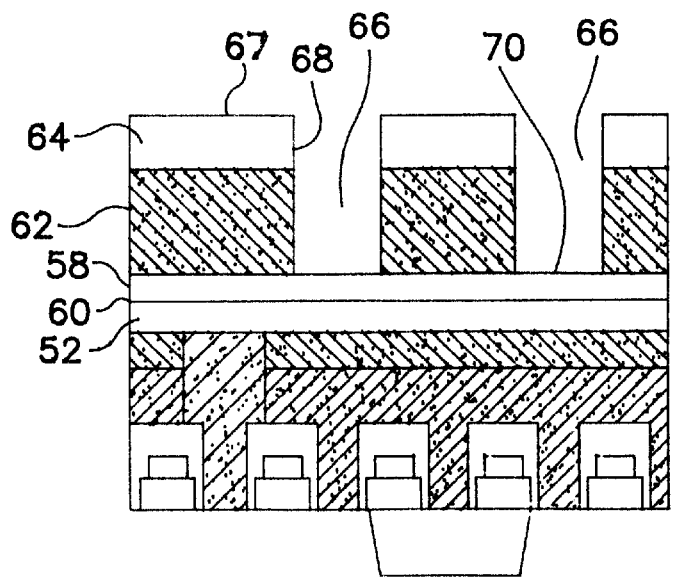
Figure 8B:
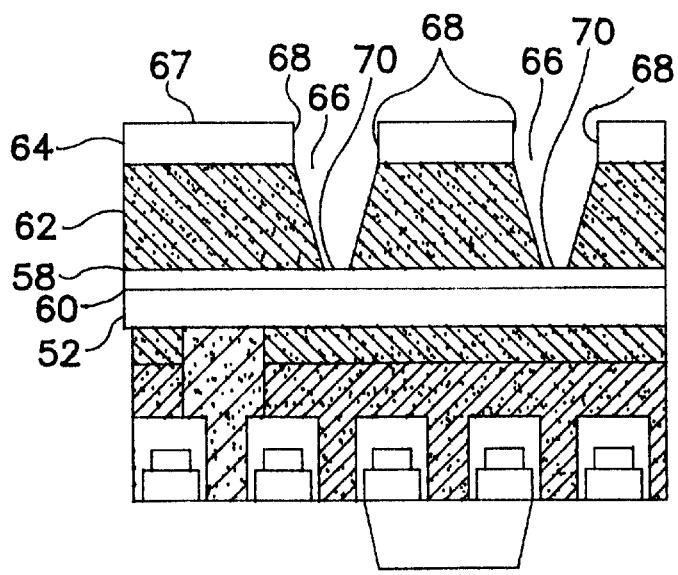

In FIGS. 8a and 8b, openings 66 are etched through hard mask layer 64, and dielectric layer 62, stopping on dielectric layer 58. This etch can produce either nearly vertical sidewalls as shown in FIG. 8a or a tapered sidewall as shown in FIG. 8b. Both of these etch profiles can be obtained by reactive ion etching (RIE) with the amount of taper determined by the chemistry used during the etch process. The control of the sidewall taper during RIE is well known in the art.

Figure 9A:
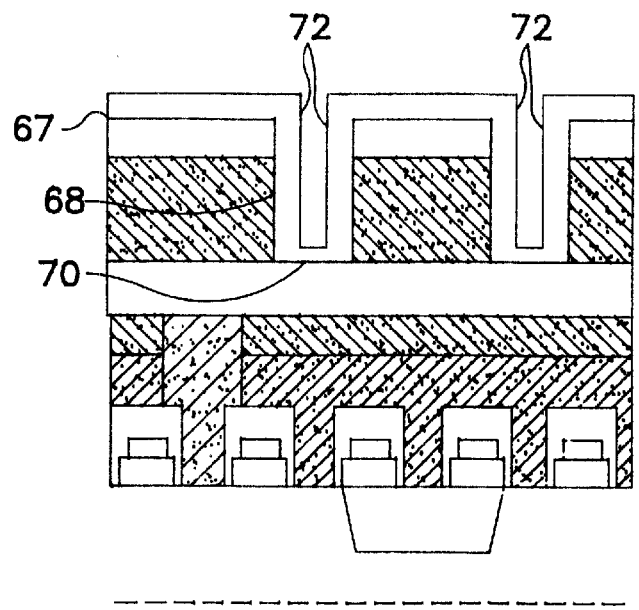
Figure 9B:
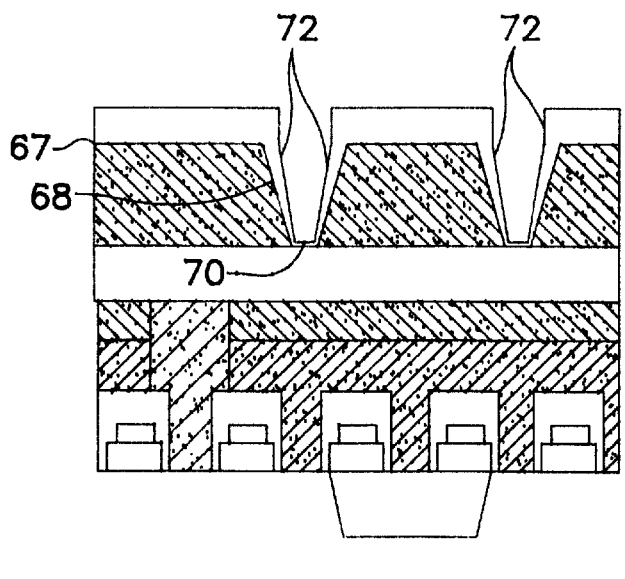

In FIGS. 9a and 9b, a liner 72 is deposited on surface 67, sidewalls 68 and bottom 70 of openings 66 etched in FIGS. 8a and 8b. Sidewalls 68 are a second sidewall of the present invention. Liner 72 could be silicon nitride, polycrystalline silicon, amorphous silicon, a metal, insulator, or semiconductor. Liner 72 can be deposited by low pressure chemical vapor deposition (LPCVD) plasma enhanced chemical vapor deposition (PECVD), physical vapor deposition (PVD), spin-on or sol-gel processing, evaporation, or other techniques commonly used in semiconductor processing. The thickness of liner 72 is nominally 200–800 Å.

Figure 10:
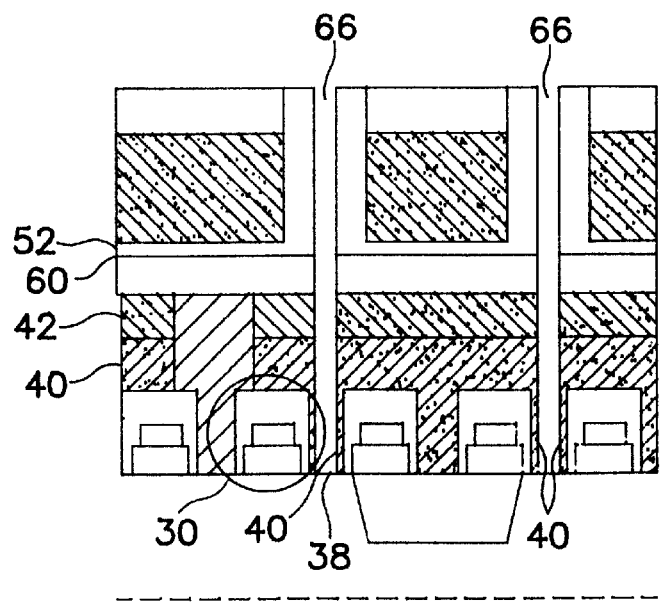
Figure 11:
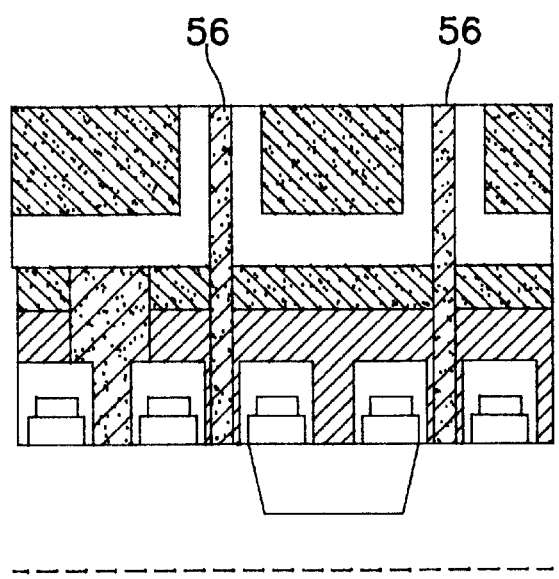

In FIG. 10 a reactive ion etch is used to form the VIA through layers 58, 42, 40,36 and 38 to the diffusion region in substrate 34. These VIAs are formed between metal bit-lines 52. This etch can be selective to sidewall spacer 50, in which case the contact is said to be quasi-borderless to the bit line, or nonselective to sidewall spacer 50, in which case the contact is bordered to the bit-line. A layer 56 which can consist of polycrystalline silicon, amorphous silicon, a metal stack such as TiN/W, is then deposited into openings 66 using low pressure chemical vapor deposition process, a plasma enhanced chemical vapor deposition process. The thickness of layer 56 is nominally 2000–4000 Å. Layer 56 is then planarized by using chemical mechanical polishing or an etch back process to planarize the surface and remove the hard-mask layer 64 as shown in FIG. 11.

Figure 12:
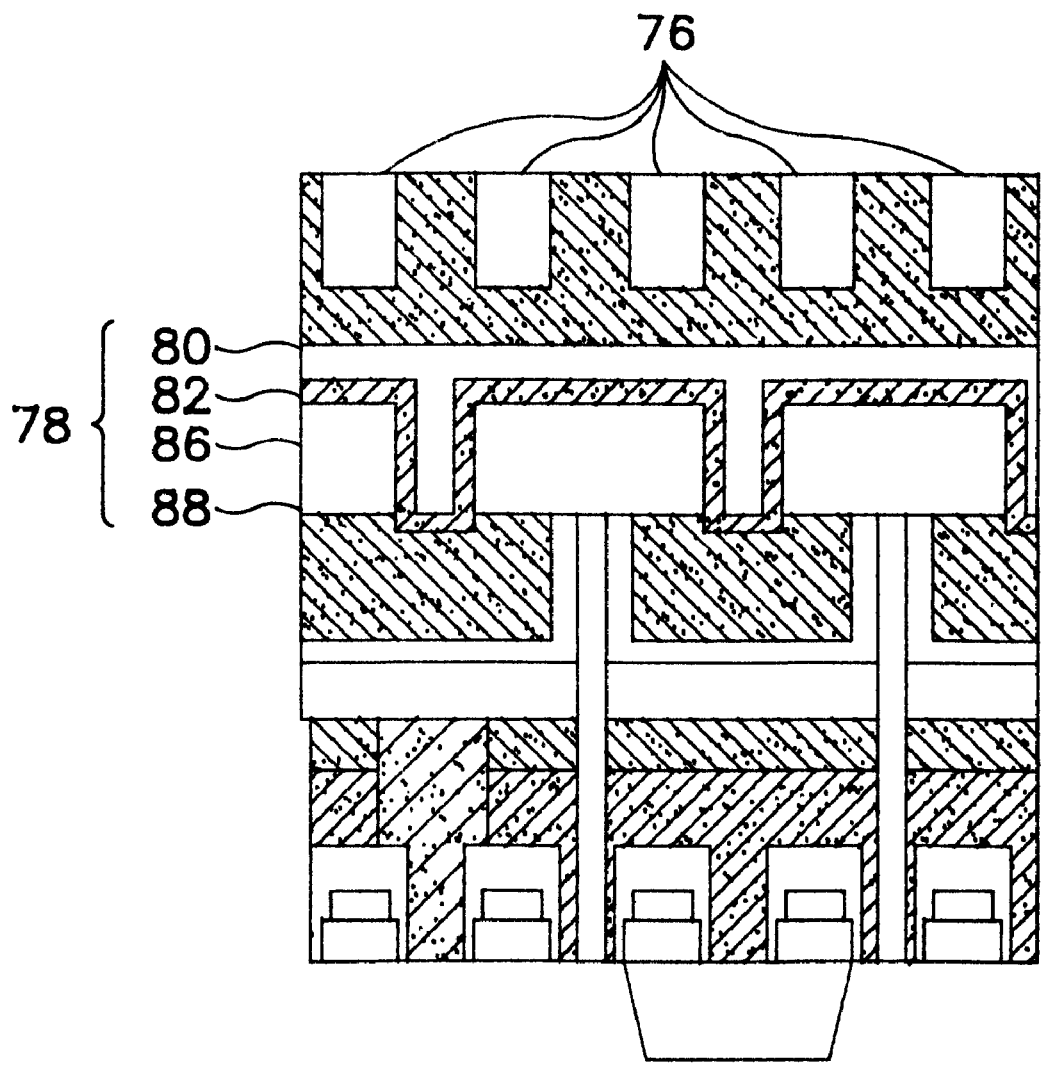
FIG. 12 shows a cross-sectional view of the completed DRAM cell of the present invention.

In FIG. 12, completed DRAM capacitor 10 is shown with an additional metal layer 76. In an exemplary embodiment, metal layer 76 is Tungsten or Aluminum. A capacitor 78 is also formed. Capacitor 78 is comprised of capacitor plate electrode 80, capacitor dielectric 82, capacitor bottom electrode 86, and barrier layer 88.

While particular embodiments of the present invention are discussed herein, it is not intended to limit the scope of such disclosure. Changes and modifications may be incorporated and embodied within the scope of the following claims.

What is claimed:

1. A method of fabricating a DRAM capacitor contact on top of a conducting bit-line, formed on a silicon substrate having a planarized dielectric layer, comprising the steps of:
    depositing at least one dielectric layer on top of said planarized dielectric layer with inlaid conducting lines formed in said dielectric layers, said at least one dielectric layer having a top most layer and said top most layer having a top surface;
    a plurality of VIAs, each VIA having sidewalls and a bottom floor in the top most of said at least one dielectric layer;
    forming spacers on said sidewalls, said spacers having a thickness from 100 to 1000 Å;
    forming a sidewall liner coating on each of said sidewalls of said top most of said at least one dielectric layer;
    etching said VIAs down to said silicon substrate;
    depositing a conductive material in each of said VIAs so that a bottom of said conducting bit-line contacts said at least one dielectric layer, said conductive material having first metal layer and second metal layer, said first metal layer of a thickness of 50 to 300 Å, and said second layer having a thickness of 2000 to 4000 Å; and
    planarizing said top surface.

2. A method of fabricating a DRAM capacitor contact in accordance with claim 1 wherein said sidewall liner is selected from the group consisting of at least one of silicon oxide, silicon nitride, polycrystalline silicon, amorphous silicon, doped silicon, titanium nitride, tungsten, titanium, tantalum, tantalum nitride, titanium oxide, tantalum oxide, doped silicon oxide or carbon.

3. A method of fabricating a DRAM capacitor contact in accordance with claim 2 wherein said sidewall liner is deposited by chemical vapor deposition.

4. A method of fabricating a DRAM capacitor contact in accordance with claim 1 wherein said conductive material VIA is selected the group consisting of at least one of doped polycrystalline silicon, doped amorphous silicon, tungsten, titanium, titanium nitride, tantalum nitride, or copper.

5. A method of fabricating a DRAM capacitor contact in accordance with claim 1 comprising the additional steps of depositing said liner coating on said bottom floor of said VIAs in addition to said sidewalls of said VIAs, and etching said liner coating deposited on said bottom floor of said VIAs to remove said liner coating.

6. A method of fabricating a DRAM capacitor contact in accordance with claim 1 comprising the further step of polishing said metal layer following its deposition.

7. A method of fabricating a DRAM capacitor in accordance with claim 1 comprising the further step of depositing a third oxide layer on top of said metal layer, following its polishing.

8. A method of fabricating a DRAM capacitor contact in accordance with claim 1 wherein said sidewalls of said VIAs are substantially vertical.

9. A method of fabricating a DRAM capacitor contact in accordance with claim 1 wherein said sidewalls of said VIAs are tapered.

10. A method of fabricating a DRAM capacitor contact on top of a conducting bit-line, formed on a silicon substrate having a planarized dielectric layer, in accordance with claim 1 comprising the additional steps of:
    depositing at least one new dielectric layer on top of said planarized dielectric layer, said at least one new dielectric layer having a top most layer and said top most layer having a top surface;
    forming a mask layer on said top surface of said at least one new dielectric layer;
    etching said at least one new dielectric layer and said mask layer down to said planarized dielectric layer forming sidewalls;
    depositing a liner on each of said sidewalls; and
    forming a plug, positioned between said liners deposited on each of said sidewalls.

11. A method of fabricating a DRAM capacitor in accordance with claim 10, wherein each of said sidewalls are formed with a taper.

12. A method of fabricating a DRAM capacitor in accordance with claim 10, wherein each of said sidewalls are formed substantially vertical and parallel to each other.

13. A method of fabricating a DRAM capacitor in accordance with claim 1, wherein said VIAs are selectively etched to a sidewall spacer.

14. A method of fabricating a DRAM capacitor in accordance with claim 1, wherein said VIAs are non-selectively etched to a sidewall spacer.

* * * * *